United States Patent
Sell et al.

(10) Patent No.: US 7,663,192 B2
(45) Date of Patent: Feb. 16, 2010

(54) CMOS DEVICE AND METHOD OF MANUFACTURING SAME

(75) Inventors: Bernhard Sell, Portland, OR (US); Anand Murthy, Portland, OR (US); Mark Liu, West Linn, OR (US); Daniel Aubertine, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 12/215,989

(22) Filed: Jun. 30, 2008

(65) Prior Publication Data

US 2009/0321838 A1  Dec. 31, 2009

(51) Int. Cl.
*H01L 27/092* (2006.01)
(52) U.S. Cl. ............... 257/369; 438/199; 257/E27.062
(58) Field of Classification Search ............... 257/369, 257/347, E27.062; 438/199, 233
See application file for complete search history.

(56) References Cited

U.S. PATENT DOCUMENTS

| 2008/0048261 A1* | 2/2008 | Morikado ............... 257/347 |
| 2008/0203477 A1* | 8/2008 | Yamazaki et al. ......... 257/347 |
| 2009/0001468 A1* | 1/2009 | Shin .................... 257/347 |
| 2009/0039434 A1* | 2/2009 | Doris et al. ............. 257/369 |
| 2009/0108350 A1* | 4/2009 | Cai et al. ............... 257/347 |
| 2009/0146211 A1* | 6/2009 | Cote et al. .............. 257/347 |

* cited by examiner

*Primary Examiner*—Nathan W Ha

(57) ABSTRACT

A CMOS device includes NMOS (110) and PMOS (130) transistors, each of which include a gate electrode (111, 131) and a gate insulator (112, 132) that defines a gate insulator plane (150, 170). The transistors each further include source/drain regions (113/114, 133/134) having a first portion (115, 135) below the gate insulator plane and a second portion (116, 136) above the gate insulator plane, and an electrically insulating material (117). The NMOS transistor further includes a blocking layer (121) having a portion (122) between the gate electrode and a source contact (118) and a portion (123) between the gate electrode and a drain contact (119). The PMOS transistor further includes a blocking layer (141) having a portion (142) between the source region and the insulating material and a portion (143) between the drain region and the insulating material.

20 Claims, 5 Drawing Sheets

CMOS DEVICE AND METHOD OF MANUFACTURING SAME

FIELD OF THE INVENTION

The disclosed embodiments of the invention relate generally to CMOS devices, and relate more particularly to CMOS transistors having level NMOS and PMOS source/drain structures.

BACKGROUND OF THE INVENTION

Complementary metal-oxide-semiconductor (CMOS) logic uses both p-type (PMOS) and n-type (NMOS) metal-oxide-semiconductor field-effect transistors (MOSFETS) to form circuit devices for computer systems. The state of the art NMOS transistor with salicide formed through the contact hole has a high external resistance due to a current pinch-off between the salicide region and the extension. This problem is expected to be especially severe on tight pitch structures as they will be present on future logic transistor technologies.

BRIEF DESCRIPTION OF THE DRAWINGS

The disclosed embodiments will be better understood from a reading of the following detailed description, taken in conjunction with the accompanying figures in the drawings in which.

Figure 1:
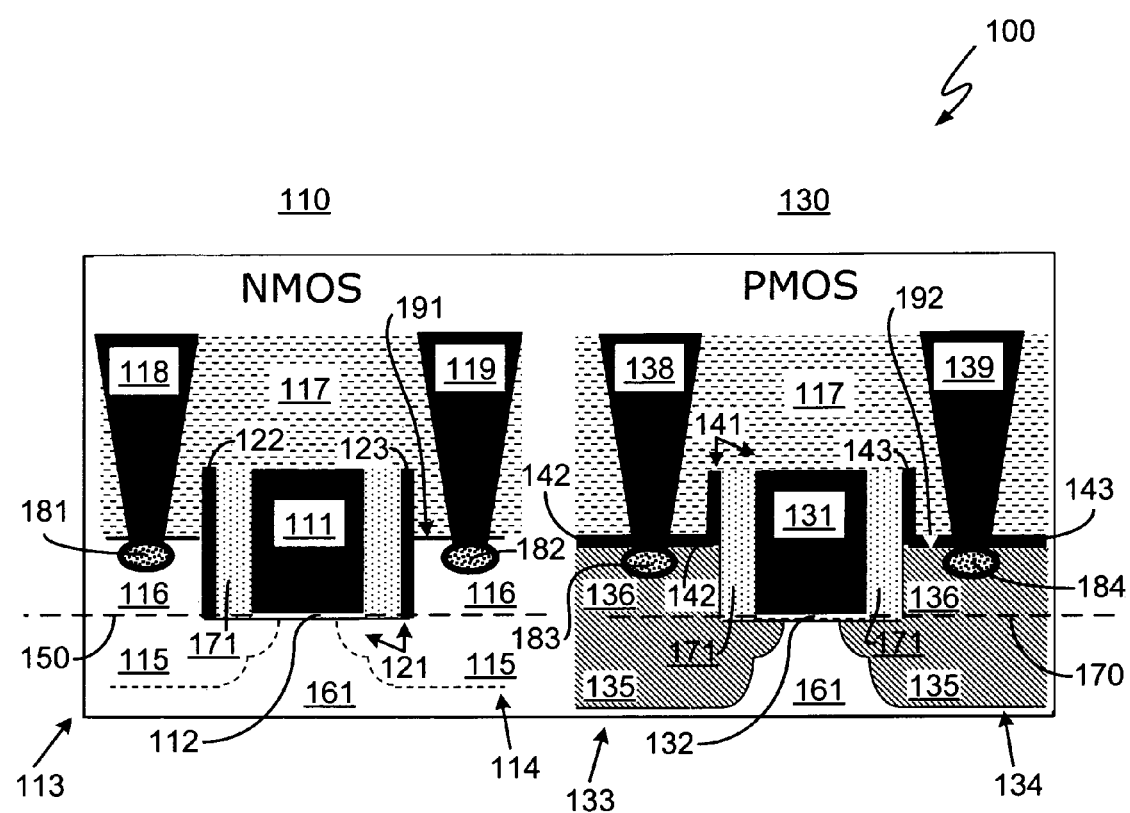
FIG. 1 is a cross-sectional view of a CMOS device according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a CMOS device comprises NMOS and PMOS transistors, each of which comprise a gate electrode and a gate insulator under the gate electrode that defines a gate insulator plane. The NMOS and PMOS transistors each further comprise a source region and a drain region, both of which have a first portion below the gate insulator plane and a second portion above the gate insulator plane, an electrically insulating material above the gate insulator plane, and a source contact extending through the electrically insulating material and terminating in the second portion of the source region and a drain contact extending through the electrically insulating material and terminating in the second portion of the drain region. The NMOS transistor further comprises a blocking layer having a first portion between the gate electrode and the source contact and a second portion between the gate electrode and the drain contact. The PMOS transistor further comprises a blocking layer having a first portion between the source region and the electrically insulating material and a second portion between the drain region and the electrically insulating material.

As will be discussed in detail below, embodiments of the invention integrate the epitaxial NMOS raised source/drain with the state of the art PMOS process with epitaxial extensions and metal gate. Accordingly, embodiments of the invention improve the NMOS transistor drive current and enable the integration of the NMOS transistor with the state-of-the-art PMOS transistor.

Referring now to the drawings, FIG. 1 is a cross-sectional view of a CMOS device 100 according to an embodiment of the invention. As illustrated in FIG. 1, CMOS device 100 comprises an NMOS transistor 110 and a PMOS transistor 130.

NMOS transistor 110 comprises a substrate 161, a gate electrode 111 over substrate 161, and a gate oxide or other gate insulator 112 under gate electrode 111. Spacers 171 flank gate electrode 111. Gate insulator 112 defines a gate insulator plane 150. (In other words, the plane in which gate insulator 112 is located is gate insulator plane 150.) NMOS transistor 110 further comprises a source region 113 and a drain region 114 (these could be reversed such that the source region occupies the space indicated by reference numeral 114 and the drain region occupies the space indicated by reference numeral 113), both of which have a portion 115 below gate insulator plane 150 and a portion 116 above gate insulator plane 150. It should be understood that there may be no visible or physical boundary between portions 115 and 116 of source/drain regions 113/114 and that the only distinction between the two portions may be that made here for purposes of discussion.

NMOS transistor 110 still further comprises an electrically insulating material 117 above gate insulator plane 150, a source contact 118 extending through electrically insulating material 117 and terminating in portion 116 of source region 113, a drain contact 119 extending through electrically insulating material 117 and terminating in portion 116 of drain region 114, and a blocking layer 121 having a portion 122 between gate electrode 111 and source contact 118 and a portion 123 between gate electrode 111 and drain contact 119. (Source contact 118 and drain contact 119 would be reversed if the source and drain regions are reversed as described above.) As an example, electrically insulating material 117 can act as an interlayer dielectric (ILD). As an example, the ILD can comprise silicon dioxide ($SiO_2$) or the like.

Similarly, PMOS transistor 130 comprises substrate 161, a gate electrode 131 over substrate 161, and a gate oxide or other gate insulator 132 under gate electrode 131. Spacers 171 flank gate electrode 131. Gate insulator 132 defines a gate insulator plane 170. (In other words, the plane in which gate insulator 132 is located is gate insulator plane 170.) In one embodiment, gate insulator plane 150 and gate insulator plane 170 are the identical plane.

PMOS transistor 130 further comprises a source region 133 and a drain region 134 (these could be reversed such that the source region occupies the space indicated by reference numeral 134 and the drain region occupies the space indicated by reference numeral 133), both of which have a portion 135 below gate insulator plane 170 and a portion 136 above gate insulator plane 170. It should be understood that there may be no visible or physical boundary between portions 135 and 136 of source/drain regions 133/134 and that the only distinction between the two portions may be that made here for purposes of discussion.

PMOS transistor 130 still further comprises electrically insulating material 117 above gate insulator plane 170, a source contact 138 extending through electrically insulating material 117 and terminating in portion 136 of source region 133, a drain contact 139 extending through electrically insulating material 117 and terminating in portion 136 of drain region 134, and a blocking layer 141 having a portion 142 between source region 133 and electrically insulating material 117 and a portion 143 between drain region 134 and electrically insulating material 117. (Source contact 138 and drain contact 139 would be reversed if the source and drain regions are reversed as described above.)

CMOS device 100 further comprises a salicide region 181 in portion 116 of source region 113, a salicide region 182 in portion 116 of drain region 114, a salicide region 183 in portion 136 of source region 133, and a salicide region 184 in portion 136 of drain region 134. As illustrated, source contact 118 terminates on salicide region 181, drain contact 119 terminates on salicide region 182, source contact 138 terminates on salicide region 183, and drain contact 139 terminates on salicide region 184.

In one embodiment, portion 116 of source region 113 and portion 116 of drain region 114 comprise an epitaxial semiconducting layer. As illustrated in FIG. 1, portion 116 has a surface 191. Also illustrated is that portion 136 has a surface 192. It should be noted that, at least in the illustrated embodiment, surfaces 191 and 192 both lie in substantially the same (unlabeled) plane, which plane is above both of gate insulator planes 150 and 170.

In a particular embodiment, the epitaxial semiconducting layer has a thickness between approximately 5 nanometers (nm) and approximately 30 nm. (At thicknesses less than approximately 5 nm the benefit of the epitaxial film on the NMOS source/drain diffusion becomes insignificant, while at thicknesses greater than approximately 30 nm the external resistance of the device is degraded due to the added source/drain resistance.) In the same or another embodiment, blocking layer 121 and blocking layer 141 have a thickness between approximately 3 nm and approximately 10 nm. More specifically, the blocking layer needs to be just thick enough to prevent the formation of NMOS epitaxial source/drain on the PMOS device—3 nm can be sufficient for that. On the other hand, if the layer is too thick, i.e., thicker than approximately 10 nm, it can degrade device performance if it starts to reduce the contact area (increasing the external resistance thereby). As an example, blocking layer 121 and blocking layer 141 can comprise silicon-carbide, silicon-nitride, or another material having a low etch rate in hydrofluoric acid (so as not to be negatively affected by cleaning steps that occur during the manufacturing process flow subsequent to the formation of the blocking layer).

Figure 2:
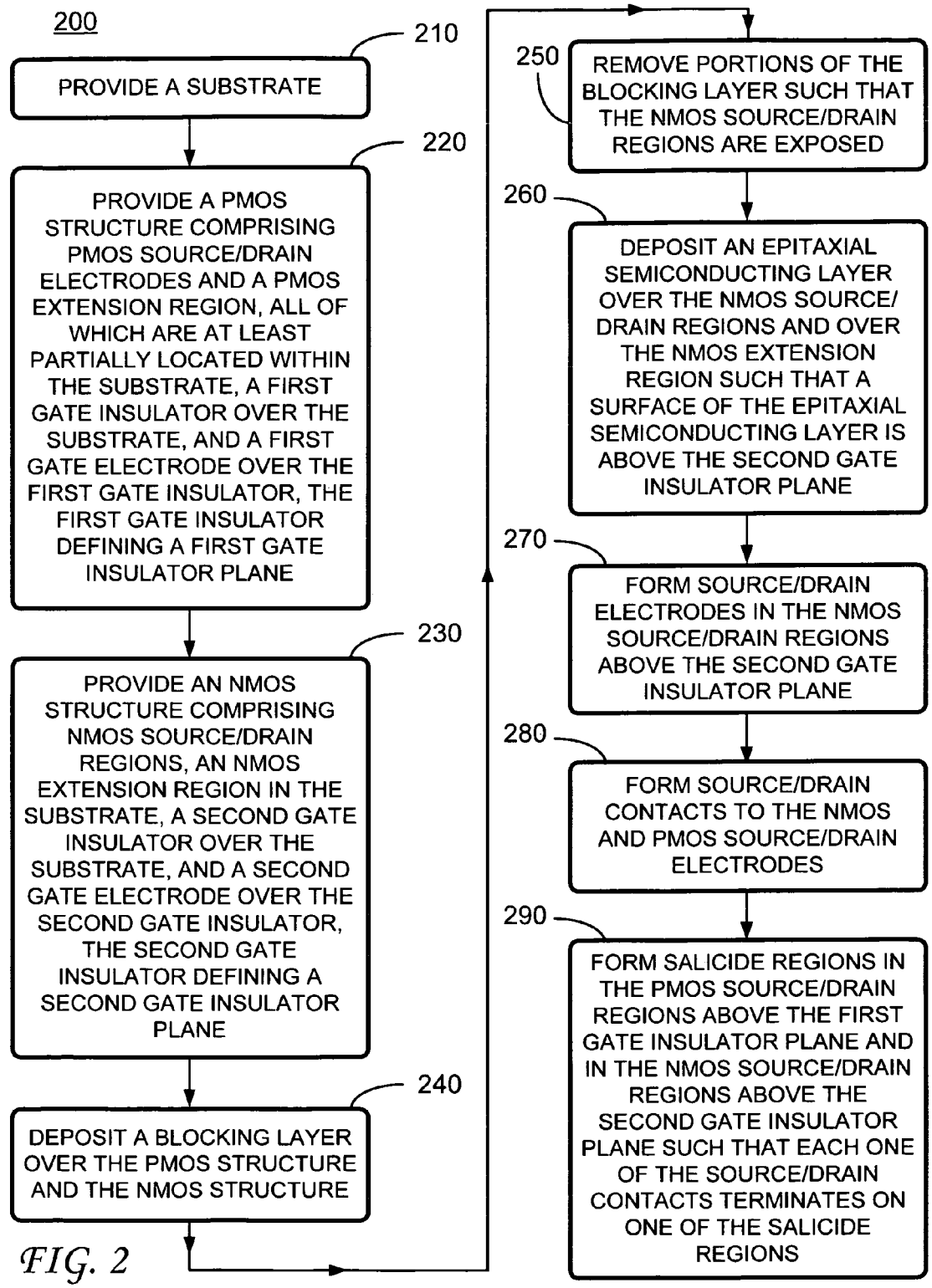
FIG. 2 is a flowchart illustrating a method of manufacturing a CMOS device according to an embodiment of the invention.

FIG. 2 is a flowchart illustrating a method 200 of manufacturing a CMOS device according to an embodiment of the invention. As an example, method 200 may result in the formation of a CMOS device that is similar to CMOS device 100 that is shown in FIG. 1.

A step 210 of method 200 is to provide a substrate. As an example, the substrate can be similar to substrate 161 that is shown in FIG. 1.

A step 220 of method 200 is to provide a PMOS structure comprising PMOS source/drain electrodes and a PMOS extension region, all of which are at least partially located within the substrate, a first gate insulator over the substrate, and a first gate electrode over the first gate insulator, the first gate insulator defining a first gate insulator plane. As an example, the PMOS structure, the source/drain electrodes, the first gate insulator, the first gate electrode, and the first gate insulator plane can be similar to, respectively, PMOS structure 130, source/drain electrodes (unlabeled) in source/drain regions 133/134, gate insulator 132, gate electrode 131, and gate insulator plane 170, all of which are shown in FIG. 1. The PMOS extension regions are not labeled in the figures but are adjacent to (and have no physical separation from) source/drain regions 133/134. These features are also shown in FIG. 1.

A step 230 of method 200 is to provide an NMOS structure comprising NMOS source/drain regions, an NMOS extension region in the substrate, a second gate insulator over the substrate, and a second gate electrode over the second gate insulator, the second gate insulator defining a second gate insulator plane. As an example, the NMOS structure, the NMOS source/drain regions, the second gate insulator, the second gate electrode, and the second gate insulator plane can be similar to, respectively, NMOS structure 110, NMOS source/drain regions 113/114, gate insulator 112, gate electrode 111, and gate insulator plane 150, all of which are shown in FIG. 1. The NMOS extension regions are not labeled in the figures but are adjacent to (and have no physical separation from) source/drain regions 113/114. These features are also shown in FIG. 1.

Figure 3:
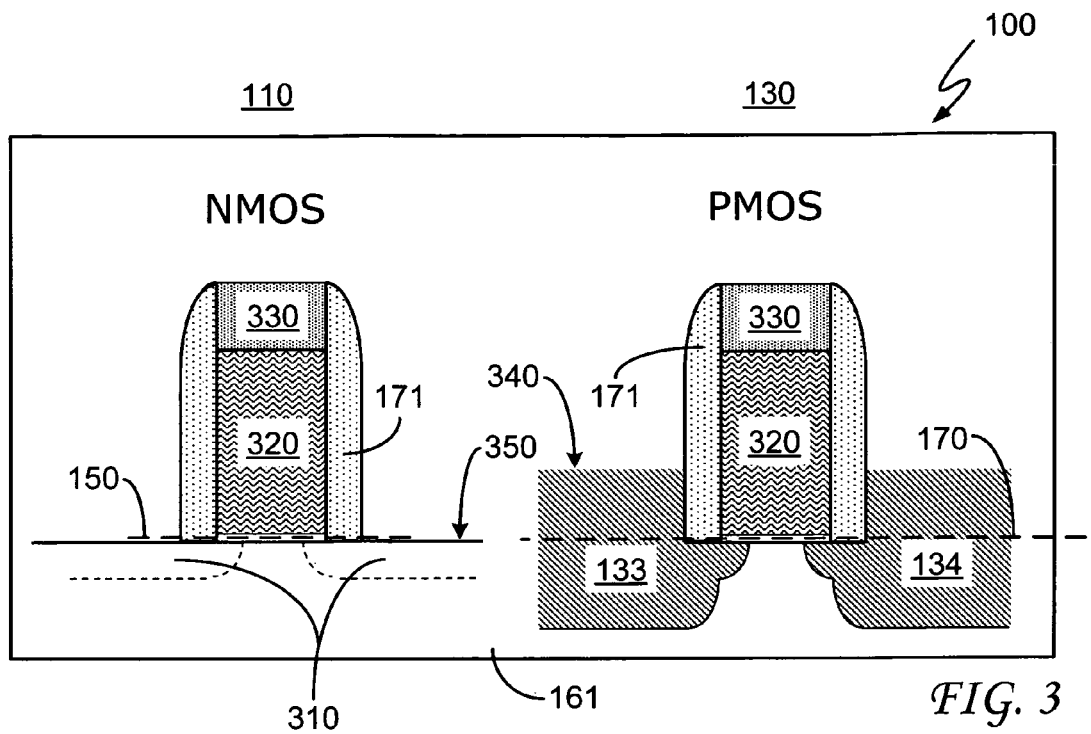
FIGS. 3-7 are cross-sectional views of the CMOS device of FIG. 1 at various particular points in its manufacturing process according to an embodiment of the invention.

FIG. 3 is a cross-sectional view of CMOS device 100 following the performance of steps 210, 220, and 230 according to an embodiment of the invention. Visible in FIG. 3 are substrate 161, NMOS structure 110, gate insulator plane 150, PMOS structure 130, PMOS source region (and extension) 133, PMOS drain region (and extension) 134, gate insulator plane 170, spacers 171, and NMOS source/drain regions (and extension) 310. Also visible, as components of both the NMOS and the PMOS structures, are a sacrificial gate 320 and a gate hard mask 330 that are used in a "gate-last" process flow according to an embodiment of the invention. Alternatively, "gate-first" process flows may be used, and in such cases the sacrificial gate would not appear.

It may be seen that at the particular manufacturing stage depicted in FIG. 3, a PMOS diffusion level (indicated by reference numeral 340) is located above an NMOS diffusion level (indicated by reference numeral 350). This difference in NMOS and PMOS diffusion level height is a major reason for the current pinch-off problem that was mentioned above in the background section. More specifically, with NMOS diffusion at the level shown in FIG. 3, current crowding or current pinch-off occurs between the salicide region (not shown in FIG. 3) and NMOS extension 310 because the salicide region must be formed much deeper within the NMOS structure and there is so little room between the channel and the interface in which to spread the flow of current. Also, because the source/drain contact etch must be of longer duration in order for the contacts to reach the deeper salicide regions, the chances of shorting the contact to the gate increases significantly.

A step 240 of method 200 is to deposit a blocking layer over the PMOS structure and the NMOS structure. As an example, portions of the blocking layer can be similar to blocking layers 121 and 141 that are shown in FIG. 1. Accordingly, in one embodiment step 240 comprises depositing one of a silicon-carbide layer and a silicon-nitride layer.

Figure 4:
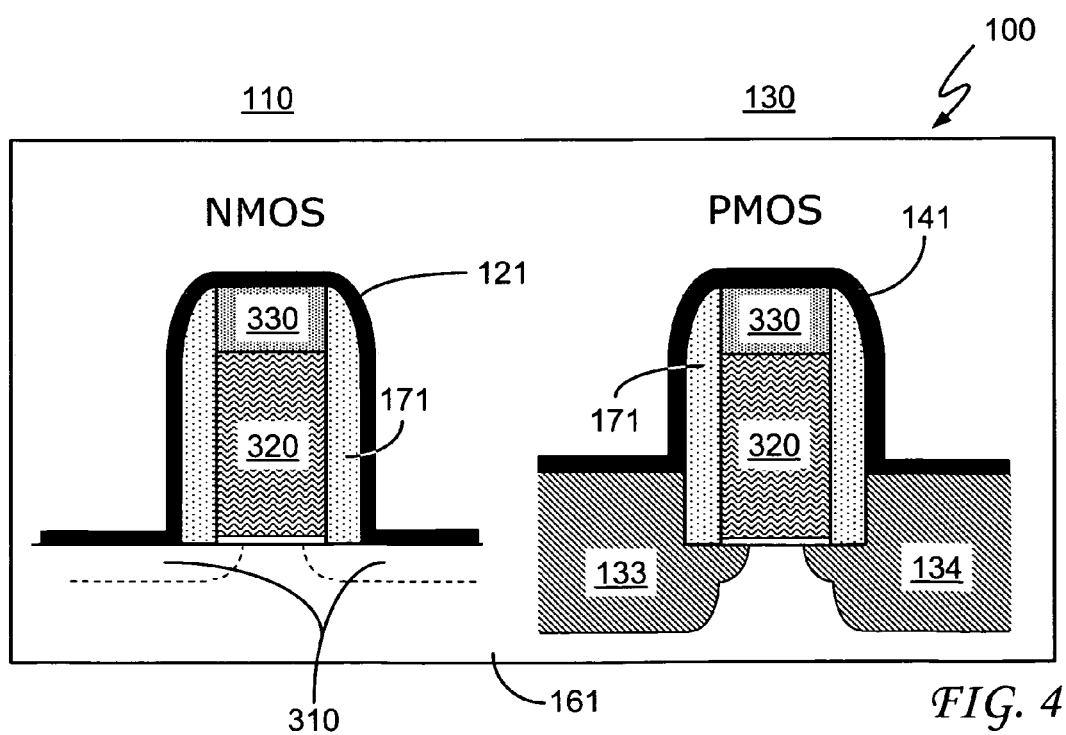

FIG. 4 is a cross-sectional view of CMOS device 100 following the performance of step 240 according to an embodiment of the invention. FIG. 4 depicts blocking layers 121 and 141 as they appear at a time shortly after their deposition when they are continuous over all or substantially all of the NMOS and PMOS structures. (In order to avoid unnecessarily cluttering the drawing, the reference numerals for certain features, such as gate insulator planes 150 and 170, PMOS diffusion level 340, and NMOS diffusion level 350, have been omitted from FIG. 4.)

Figure 5:
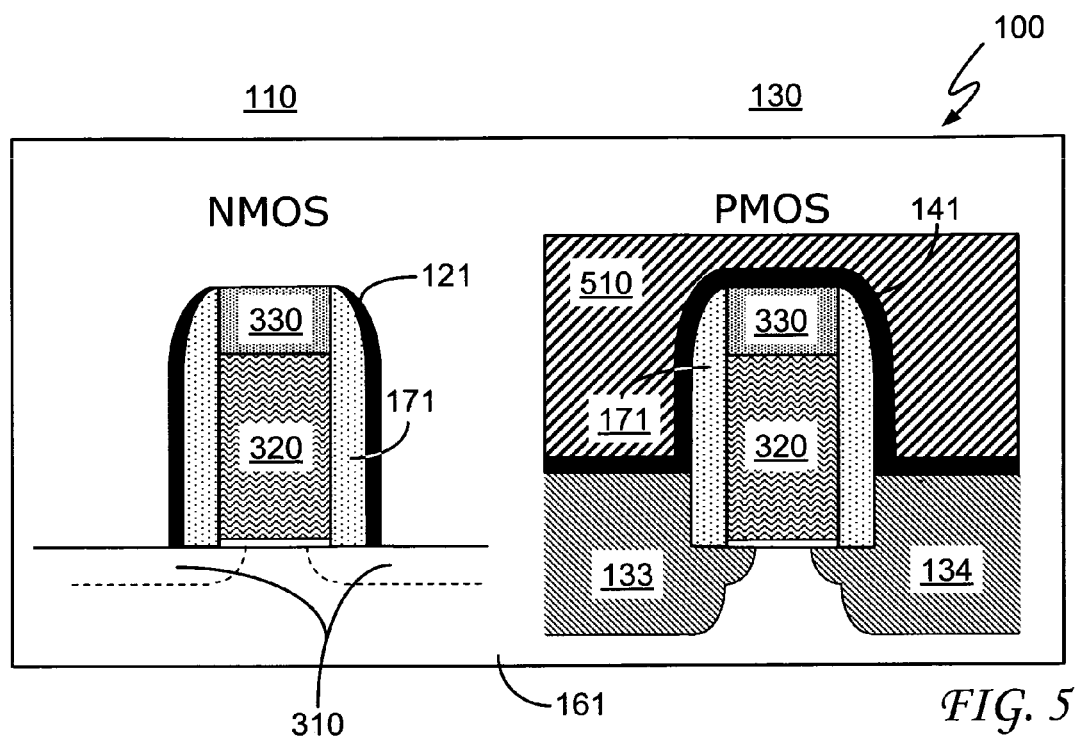

A step 250 of method 200 is to remove portions of the blocking layer such that the NMOS source/drain regions are exposed. FIG. 5 is a cross-sectional view of CMOS device 100 following the performance of step 250 according to an embodiment of the invention. (As was the case with FIG. 4, in order to avoid unnecessarily cluttering the drawing, the reference numerals for certain features have been omitted from FIG. 5.)

As illustrated in FIG. 5, blocking layer 121 has been removed from over NMOS source/drain regions (and extension) 310. FIG. 5, by depicting a photoresist 510 over PMOS structure 130, also provides insight into a manner in which this may be done. As an example, photoresist 510 may be spun on over both NMOS and PMOS structures (e.g., using known techniques) and then removed from NMOS transistors using standard lithography. Subsequently, a dry etch may be used to remove blocking layer 121 from NMOS source/drain regions (and extension) 310. Suitable chemistries for this etch are (for example) carbon tetrafluoride (also referred to as tetrafluoromethane and Freon-14, among other names) ($CF_4$) and trifluoromethane (also referred to as fluoroform and Freon-23, among other names) ($CHF_3$).

A step 260 of method 200 is to deposit an epitaxial semiconducting layer over the NMOS source/drain regions and over the NMOS extension region such that a surface of the epitaxial semiconducting layer is above the second gate insulator plane. As an example, the epitaxial semiconducting layer can be similar to portion 116 of source/drain regions 113/114 that is shown in FIG. 1. Accordingly, in one embodiment step 260 comprises depositing the epitaxial semiconducting layer such that it has a thickness between approximately 5 nm and approximately 30 nm.

The surface of the epitaxial semiconducting layer, though visible in FIG. 1, is not labeled with a reference numeral. The surface of the epitaxial semiconducting layer is both visible and labeled with a reference numeral in FIG. 6, described below. In one embodiment, step 260 comprises using a low-temperature (e.g., between approximately 700° C. and approximately 800° C.) selective epitaxial silicon deposition process to deposit a silicon layer on the NMOS diffusion. It should be understood that if the temperature is too high then the extensions will diffuse more than is wanted, thus affecting performance. Although silicon is given as a possible material for the epitaxial semiconducting layer, other materials (such as other Group IV semiconductors or other films grown with the same crystalline orientation as the substrate) may also be used according to various embodiments of the invention.

Figure 6:
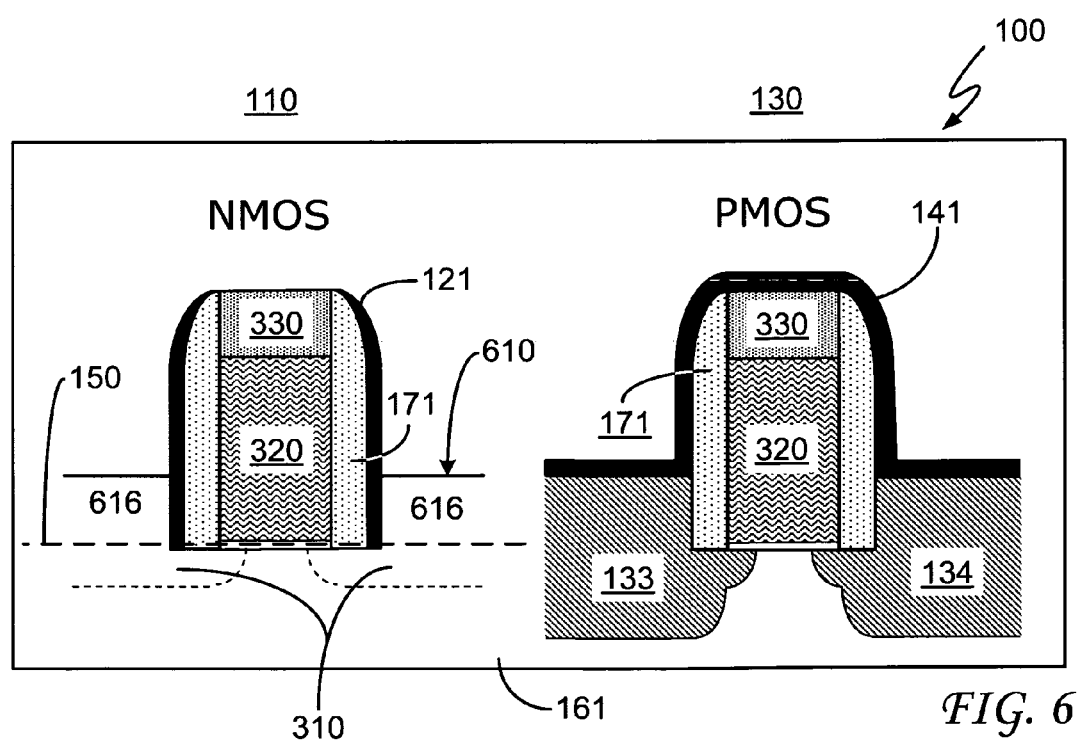
Figure 7:
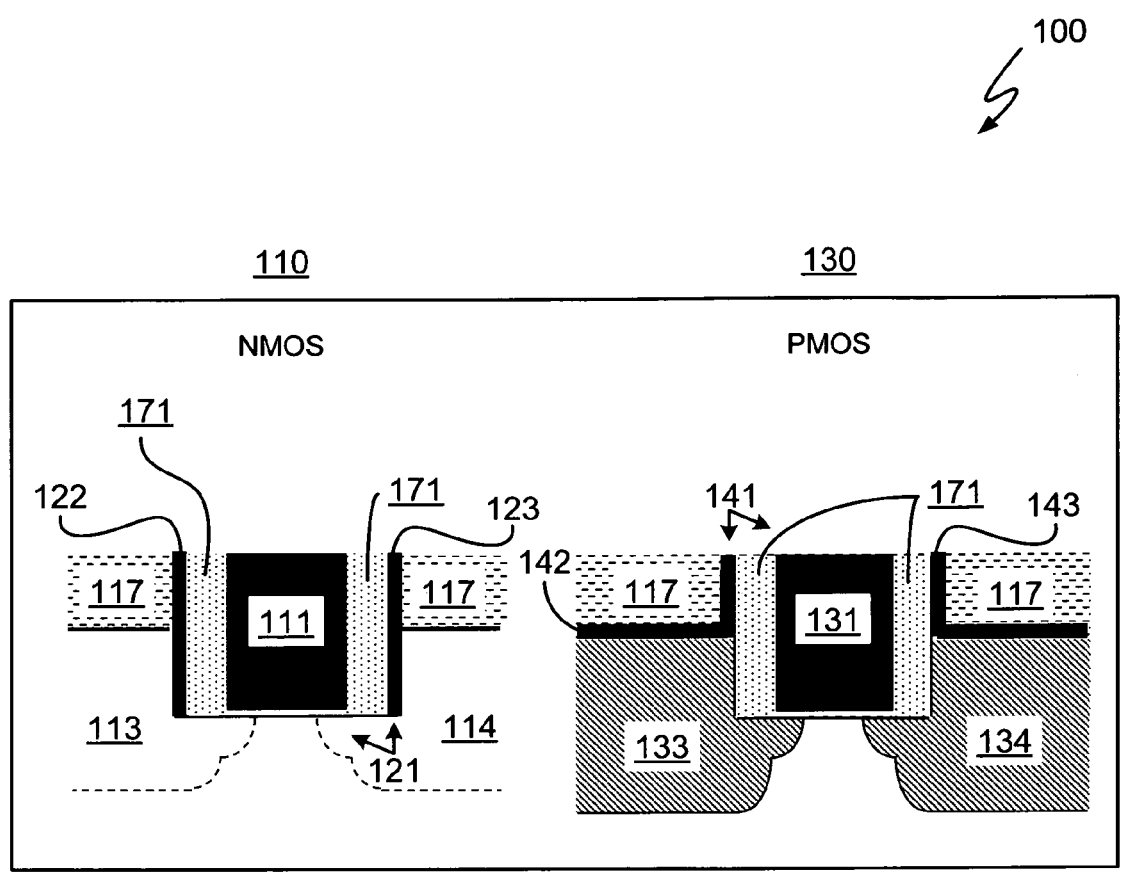

FIGS. 6 and 7 are cross-sectional views of CMOS device 100 following the performance of step 260 according to an embodiment of the invention. As illustrated in FIG. 6, an epitaxial semiconducting layer 616 has been deposited over NMOS source/drain regions (and extension) 310 such that a surface 610 of epitaxial semiconducting layer 616 (as well as epitaxial semiconducting layer 616 itself) is above gate insulator plane 150. Prior to this, photoresist 510 was removed (such as with a standard ash or the like) and any surface contamination on the NMOS diffusion was also removed. As an example, the surface contamination may be removed with a wet clean (e.g., by using hydrofluoric acid or the like) or with another suitable process.

A step 270 of method 200 is to form source/drain electrodes in the NMOS source/drain regions above the second gate insulator plane. (In some embodiments portions of these source/drain electrodes may extend below the second gate insulator plane.) In one embodiment, step 270 comprises implanting the NMOS diffusion with an n-type dopant such as phosphorous (approximate dose $5e^{15}$ to $5e^{16}$; approximate energy 5 KeV to 15 KeV) or arsenic (approximate dose $5e^{15}$ to $5e^{16}$; approximate energy 10 KeV to 30 KeV) and annealed between approximately 900 degrees Celsius (° C.) and approximately 1200° C. to form the NMOS source/drain electrodes. FIG. 7 depicts CMOS device 100 following the performance of step 270 and after the formation of final NMOS gate 111 and final PMOS gate 131 and of electrically insulating material 117.

A step 280 of method 200 is to form source/drain contacts to the NMOS and PMOS source/drain electrodes. As an example, the source/drain contacts can be similar to source/drain contacts 118/119 and 138/139 that are shown in FIG. 1.

A step 290 of method 200 is to form salicide regions in the PMOS source/drain regions above the first gate insulator plane and in the NMOS source/drain regions above the second gate insulator plane such that each one of the source/drain contacts terminates on one of the salicide regions. As an example, the salicide regions can be similar to salicide regions 181, 182, 183, and 184 that are shown in FIG. 1. Following step 290, CMOS device 100 may have the appearance shown in FIG. 1. It should be noted that the contact etch does not have to be nearly as deep as it would were it performed on the structure of FIG. 3. Accordingly, the salicide may be formed above rather than below the gate insulator plane, with the result that the current crowding between the salicide and the extension is avoided, thus significantly improving the NMOS drive current. The shorter contact also reduces the risk of electrical shorts between the contact and the gate.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the CMOS devices and related manufacturing methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A CMOS device comprising:
   an NMOS transistor comprising:
      a first gate electrode;
      a first gate insulator under the first gate electrode, the first gate insulator defining a first gate insulator plane;
      a first source region and a first drain region, both of which have a first portion below the first gate insulator plane and a second portion above the first gate insulator plane;
      a first electrically insulating material above the first gate insulator plane;
      a first source contact extending through the first electrically insulating material and terminating in the second portion of the first source region and a first drain contact extending through the first electrically insulating material and terminating in the second portion of the first drain region; and
      a first blocking layer having a first portion between the first gate electrode and the first source contact and a second portion between the first gate electrode and the first drain contact; and
   a PMOS transistor comprising:
      a second gate electrode;
      a second gate insulator under the second gate electrode, the second gate insulator defining a second gate insulator plane;
      a second source region and a second drain region, both of which have a first portion below the second gate insulator plane and a second portion above the second gate insulator plane;
      a second electrically insulating material above the second gate insulator plane;
      a second source contact extending through the second electrically insulating material and terminating in the second portion of the second source region and a second drain contact extending through the second electrically insulating material and terminating in the second portion of the second drain region; and
      a second blocking layer having a first portion between the second source region and the second electrically insulating material and a second portion between the second drain region and the second electrically insulating material.

2. The CMOS device of claim 1 wherein:
the second portion of the first source region and the second portion of the first drain region comprise an epitaxial semiconducting layer.

3. The CMOS device of claim 2 wherein:
the epitaxial semiconducting layer has a thickness between approximately 5 nm and approximately 30 nm.

4. The CMOS device of claim 1 wherein:
the first blocking layer and the second blocking layer comprise one of silicon-carbide and silicon-nitride.

5. The CMOS device of claim 4 wherein:
the first blocking layer and the second blocking layer have a thickness between approximately 3 nm and approximately 10 nm.

6. The CMOS device of claim 1 further comprising:
a first salicide region in the second portion of the first source region, a second salicide region in the second portion of the first drain region, a third salicide region in the second portion of the second source region, and a fourth salicide region in the second portion of the second drain region,
wherein:
   the first source contact terminates on the first salicide region;
   the first drain contact terminates on the second salicide region;
   the second source contact terminates on the third salicide region; and
   the second drain contact terminates on the fourth salicide region.

7. The CMOS device of claim 1 wherein:
the first gate insulator plane and the second gate insulator plane are substantially identical.

8. A method of manufacturing a CMOS device, the method comprising:
   providing a substrate;
   providing a PMOS structure comprising PMOS source/drain electrodes in PMOS source/drain regions and a PMOS extension region, all of which are at least partially located within the substrate, a first gate insulator over the substrate, and a first gate electrode over the first gate insulator, wherein the first gate insulator defines a first gate insulator plane;
   providing an NMOS structure comprising NMOS source/drain regions, an NMOS extension region in the substrate, a second gate insulator over the substrate, and a second gate electrode over the second gate insulator, wherein the second gate insulator defines a second gate insulator plane;
   depositing a blocking layer over the PMOS structure and the NMOS structure;
   removing portions of the blocking layer such that the NMOS source/drain regions are exposed;
   depositing an epitaxial semiconducting layer over the NMOS source/drain regions and over the NMOS extension region such that a surface of the epitaxial semiconducting layer is above the second gate insulator plane;

forming source/drain electrodes in the NMOS source/drain regions above the second gate insulator plane; and forming source/drain contacts to the NMOS and PMOS source/drain electrodes.

9. The method of claim 8 wherein:

depositing the blocking layer comprises depositing one of a silicon-carbide layer and a silicon-nitride layer.

10. The method of claim 8 wherein:

removing portions of the blocking layer comprises:
- depositing a photo-resist over the PMOS structure and the NMOS structure;
- removing the photo-resist from the NMOS structure; and
- etching the portions of the blocking layer overlying the NMOS source/drain regions using a dry etch procedure.

11. The method of claim 10 wherein:

etching the portions of the blocking layer comprises using an etch chemistry comprising at least one of carbon tetrafluoride and trifluoromethane.

12. The method of claim 8 wherein:

depositing the epitaxial semiconducting layer comprises depositing a silicon layer at a deposition temperature between approximately 700° C. and approximately 800° C.

13. The method of claim 12 wherein:

depositing the epitaxial semiconducting layer comprises depositing the silicon layer such that it has a thickness between approximately 5 nm and approximately 30 nm.

14. The method of claim 8 further comprising:

forming salicide regions in the PMOS source/drain regions above the first gate insulator plane and in the NMOS source/drain regions above the second gate insulator plane such that each one of the source/drain contacts terminates on one of the salicide regions.

15. The method of claim 8 wherein:

the first gate insulator plane and the second gate insulator plane are substantially identical.

16. A method of manufacturing a CMOS device, the method comprising:

providing a substrate;

forming a first gate insulator over the substrate, the first gate insulator defining a first gate insulator plane;

forming a first sacrificial gate over the first gate insulator, forming a first gate hard mask over the first sacrificial gate, and forming a first set of sidewall spacers adjacent to sidewalls of the first sacrificial gate;

forming PMOS source/drain electrodes in PMOS source/drain regions and a PMOS extension region such that they are at least partially located within the substrate;

forming a second gate insulator over the substrate, the second gate insulator defining a second gate insulator plane;

forming a second sacrificial gate over the second gate insulator, forming a second gate hard mask over the second sacrificial gate, and forming a second set of sidewall spacers adjacent to sidewalls of the second sacrificial gate;

forming NMOS source/drain regions and an NMOS extension region in the substrate;

forming a blocking layer over the PMOS source/drain electrodes, the PMOS extension region, the first gate hard mask, and the first set of sidewall spacers;

depositing a silicon layer over the NMOS source/drain regions and over the NMOS extension region such that a surface of the silicon layer is above the second gate insulator plane;

removing the first gate hard mask, the first sacrificial gate, the second gate hard mask, and the second sacrificial gate and forming a first gate electrode over the first gate insulator and forming a second gate electrode over the second gate insulator;

forming source/drain electrodes in the NMOS source/drain regions above the second gate insulator plane;

forming salicide regions in the PMOS source/drain regions above the first gate insulator plane and in the NMOS source/drain regions above the second gate insulator plane; and forming source/drain contacts to the NMOS and PMOS source/drain electrodes such that each one of the source/drain contacts terminates on one of the salicide regions.

17. The method of claim 16 wherein:

the silicon layer is deposited at a deposition temperature between approximately 700° C. and approximately 800° C.

18. The method of claim 16 wherein:

the silicon layer is deposited such that it has a thickness between approximately 5 nm and approximately 30 nm.

19. The method of claim 16 wherein:

the first gate insulator plane and the second gate insulator plane are substantially identical.

20. The method of claim 16 wherein:

forming source/drain electrodes in the NMOS source/drain regions comprises:
- implanting the NMOS source/drain regions with an n-type dopant; and
- annealing the NMOS source/drain regions.

* * * * *